(12) United States Patent
Atsumo et al.

(10) Patent No.: US 7,812,689 B2
(45) Date of Patent: Oct. 12, 2010

(54) PHASE SHIFTER INCLUDING A RESONANT TYPE SWITCH WITH A FREE REGION

(75) Inventors: Takao Atsumo, Kanagawa (JP); Hiroshi Mizutani, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 105 days.

(21) Appl. No.: 12/007,561

(22) Filed: Jan. 11, 2008

(65) Prior Publication Data

US 2009/0140825 A1    Jun. 4, 2009

(30) Foreign Application Priority Data

Dec. 1, 2007   (JP) .............................. 2007-004588

(51) Int. Cl.
*H01P 1/18*    (2006.01)
*H01P 1/15*    (2006.01)

(52) U.S. Cl. ........................ 333/164; 333/139; 333/103; 333/262

(58) Field of Classification Search .................. 333/139, 333/164, 103, 104, 262, 185
See application file for complete search history.

(56) References Cited

U.S. PATENT DOCUMENTS

| | | | |
|---|---|---|---|
| 5,231,078 A * | 7/1993 | Riebman et al. ............. | 505/192 |
| 6,072,205 A | 6/2000 | Yamaguchi et al. | |
| 6,370,404 B1 * | 4/2002 | Shen ........................... | 505/210 |
| 7,239,218 B2 | 7/2007 | Nakamura | |
| 2005/0093026 A1 * | 5/2005 | Sagae et al. .................. | 257/213 |
| 2006/0001507 A1 * | 1/2006 | Nakamura ................... | 333/164 |
| 2007/0069835 A1 * | 3/2007 | Kamgaing ................... | 333/185 |

FOREIGN PATENT DOCUMENTS

| | | |
|---|---|---|
| JP | 7-66043 | 3/1995 |
| JP | 10-335590 | 12/1998 |
| JP | 2006-19823 | 1/2006 |
| KR | 1999-006532 | 1/1999 |

OTHER PUBLICATIONS

Shiban K. Koul and Bharathi Bhat, "Microwave and Milimeter Wave Phase Shifters vol. II Semiconductor and Delay Line Phase Shifters", pp. 411-413, Artech House, 1991.
Korean Office Action dated Oct. 30, 2009 with Japanese translation and partial English translation thereof.

* cited by examiner

*Primary Examiner*—Benny Lee
(74) *Attorney, Agent, or Firm*—McGinn IP Law Group PLLC

(57) ABSTRACT

Disclosed is a microwave phase shifter including switches each of which utilizes resonance between an off-capacitance of an FET and an inductor connected in parallel with the off-capacitance of the FET, an LPF, and an HPF, a series circuit of an inductor and an MIM capacitor is arranged in parallel with the FET in each portion of the resonance. In a layout of the LC series-connected circuit, though the inductor is of a non-close-packed structure, a metal member or a dielectric material having a relative dielectric constant higher than that of a dielectric substrate is arranged in a free space in a central portion of the inductor.

18 Claims, 16 Drawing Sheets

PHASE SHIFTER INCLUDING A RESONANT TYPE SWITCH WITH A FREE REGION

REFERENCE TO RELATED APPLICATION

The present application is claiming the priority of the earlier Japanese patent application No. 2007-004588 filed on Jan. 12, 2007, the entire disclosure thereof being incorporated herein by reference thereto.

FIELD OF THE INVENTION

The present invention relates to a semiconductor device. More specifically, the invention relates to a microwave phase shifter.

BACKGROUND OF THE INVENTION

Phase shifters may be classified into several types with regards to the configuration. Among these are a line-switching type where 50 Ω(ohm) lines having different lengths are connected using two SPDT (Single-Pole Dual Throw) switches (single-pole two-contact switches), and an electrical length difference between both of the lines obtained by switch changeover is used as a phase shift amount, and an HPF/LPF switching type where a plurality of lumped-constant inductors and capacitors, and SPDT switches are combined, and a phase difference caused by electrical switching between an LC type low-pass filter (LPF) and an LC high-pass filter (HPF) is used. There are also some types of switch units including a series/shunt type where a series FET (Field Effect Transistor) and a shunt FET are used concurrently and a resonant type where an inductor is connected in parallel with an FET. As will be described later, the present invention employs switches of the resonant type and a phase shifter of the HPF/LPF switching type, among these types.

In the case of filters as shown in FIG. 9, when an LPF is on, the following expression holds:

$$S_{21} = \frac{2}{2(1 - B_N X_N) + j(B_N + 2X_N - B_N X_N^2)} \quad (1)$$

In the above expression (1), $X_N$ and $B_N$ denote a normalized reactance and a normalized susceptance, respectively.

A phase of the pass characteristic $S_{21}$ is delayed. When the delay is indicated by $\Phi_1$, the delay $\Phi_1$ is given by the following expression (2):

$$\Phi_1 = \tan^{-1}\left[-\frac{B_N + 2X_N - B_N X_N^2}{2(1 - B_N X_N)}\right] \quad (2)$$

Conversely, when an FET on an HPF side in an SPDT switch unit is on, $X_N$ is substituted into $X_N$, and $B_N$ is substituted into $B_N$, and the following expression is thereby obtained:

$$S_{21} = \frac{2}{2(1 - B_N X_N) + j(-B_N - 2X_N + B_N X_N^2)} \quad (3)$$

In this case, the phase of the pass characteristic $S_{21}$ is advanced, and this advance is indicated by $\Phi_2$.

$$\Phi_2 = \tan^{-1}\left[-\frac{-B_N - 2X_N + B_N X_N^2}{2(1 - B_N X_N)}\right] \quad (4)$$

A phase shift amount is defined by a difference $\Delta\Phi$ between the phases $\Phi_1$ and $\Phi_2$, and is expressed by the following expression (5):

$$\Delta\Phi = \Phi_1 - \Phi_2 = -\tan^{-1}\left[-\frac{B_N + 2X_N - B_N X_N^2}{2(1 - B_N X_N)}\right] \quad (5)$$

When the HPF side is turned on and an LPF side is turned off in such a phase shifter, and when an inductor in the switch unit is formed of a low-resistance interconnect and a parasitic resistance of the inductor is small, a rise and fall (such as an irregularity or a bump) caused by resonance is generated in a frequency characteristic of the phase shift amount.

This deteriorates an RMS (root mean square) phase shift error indicated by the following expression:

$$\text{RMS phase shift amount} = \sqrt{\sum_{i=1}^{n} \frac{(\Delta\Phi - \Phi_0)^2}{n}} \quad (6)$$

where n indicates the number of frequency points, and $\Phi_0$ indicates a given phase shift amount.

FIG. 10 is a diagram showing a configuration of a phase shifter disclosed in Patent Document 1. As shown in FIG. 10, this phase shifter is formed by arranging two SPDT switches 11c and 11d in an input unit and an output unit, respectively, and connecting a high-pass filter (HPF) 12 and a low-pass filter (LPF) 13 between the SPDT switches 11c and 11d. In each of the SPDT switches 11c and 11d, each inductor is connected in parallel with each FET. When one of two FETs Q1 and Q3 on a side of the HPF 12 and two FETs Q5 and Q7 on a side of the LPF 13 are turned on due to gate biasing, the other of the two FETs Q1 and Q3 on the side of the HPF 12 and the two FETs Q5 and Q7 on the side of the LPF 13 are turned off. In order to more improve cutoff characteristics of the FETs that are turned off and improve pass characteristics of the FETs that are turned on, inductors L21, L22, L23 and L24 are connected in parallel with the FETs Q1, Q5, Q3, and Q7, respectively. Parallel resonance is thereby produced in a desired band. Incidentally, IN, 10a, C10, L10, SPDTSW. C11, L11, C12, L12, C13, L13, C14, L14, 10b, and OUT comprise input, output, LC circuits, capacitors, inductors, and SPDT switches, as conventionally understood in the art; however, a more detailed description of those components is not necessary to understand the present invention.

Further, it is necessary to insert a capacitor in series with each inductor in order to measure a DC characteristic of each FET. A layout configuration where the capacitor is connected in series with the inductor is usually a layout where an inductor (a spiral inductor) 22 is made to have a non-close-packed structure so as to enhance a Q factor and further, an MIM (Metal Insulator Metal) capacitor 21 is arranged outside the inductor 22, as shown in FIG. 11. FIG. 11 shows a layout of an LC series-connected monolithic filter described as a related art in Patent Document 2. The capacitor 21 and the inductor (spiral inductor) 22 are two-dimensionally arranged on a semiconductor substrate.

[Patent Document 1] JP Patent Kokai Publication No. JP-P2006-19823A

[Patent Document 2] JP Patent Kokai Publication No. JP-A-7-66043

[Non-patent Document 1] Shiban K. Koul and Bharathi Bhat, "Microwave and Milimeter Wave Phase Shifters Volume II Semiconductor and Delay Line Phase Shifters", pp 412-413, Artech House, 1991

The disclosures of the above-mentioned Patent Documents 1 and 2, and Non-Patent Document 1 are herein incorporated by reference thereto. The following analysis is given by the present invention.

In the configuration in FIG. 10, when one of the two FETs Q1 and Q3 on the side of the HPF 12 and the two FETs Q5 and Q7 on the side of the LPF 13 are turned on due to gate biasing, the other of the two FETs Q1 and Q3 on the side of the HPF 12 and the two FETs Q5 and Q7 on the side of the LPF 13 are turned off, thereby performing switching between the two FETs Q1 and Q3 and the two FETs Q5 and Q7 for use. In order to improve the pass characteristics of the FETs which are turned on, the inductors are connected in parallel with the FETs that are turned off, respectively, thereby producing parallel resonance in a desired band and bringing the FETs that are turned off into a high-impedance state. The cutoff characteristics of the FETs that are turned off are improved more. This allows a desired insertion loss and a desired phase shift amount.

In the configuration in FIG. 11, the non-close-packed inductor (spiral inductor) 22 and the MIM (Metal Insulator Metal) capacitor 21 having an area, of which an impedance becomes substantially zero in a desired band, provided on the semiconductor substrate, are connected in series. A DC current that flows through the inductor is blocked, and the DC characteristic of the FET can be measured. The DC characteristic of the FET in an on state can be approximated by resistance, while the DC characteristic of the FET on an off state can be approximated by capacitance.

An equivalent circuit of a phase shifter where a parasitic capacitance of each inductor is arranged in series with the inductor in view of the parasitic capacitance of the inductor, an HPF side is turned on, and an LPF side is turned off is as shown in FIG. 12. In the phase shifter, a circuit where an HPF is connected between two sets of on-time switch units is connected to an input unit and an output unit. In the HPF, a shunt inductor L2 is arranged between two series capacitors C2. Then, a circuit where an LPF is connected between two sets of off-time switch units is connected to the input unit and the output unit. In the LPF, a shunt capacitor C3 is arranged between two series inductors L3. Each on-time switch unit includes a resistance R1 that equivalently indicates an FET in the on state, an inductor L1 connected in parallel with the resistance R1, and a parasitic resistance R2 of the inductor L1. Each off-time switch unit includes a capacitor C1 that equivalently indicates an FET in the off state, an inductor L1 connected in parallel with the capacitor C1, and a resistance component R2 of the inductor L1.

Impedance of the LPF side as seen from an input side will be derived in the below. Since this circuit is symmetrical with respect to the filter, an equivalent circuit as shown in FIG. 13 can substitute the LPF side in FIG. 12. When the inductor has a low resistance, and when R2 is approximated to zero, the following expression holds:

$$Z = j\left(\frac{\omega L_1}{1 - \omega^2 L_1 C_1} + \omega L_3 - \frac{2}{\omega C_3}\right) \quad (7)$$

$$\text{Then, } |Z| = \frac{\omega L_1}{1 - \omega^2 L_1 C_1} + \omega L_3 - \frac{2}{\omega C_3} \quad (8)$$

A resonant frequency $\omega 0$ in a parallel resonant circuit (refer to FIG. 14) where the inductor L1 and the resistance R2 connected in series is connected in parallel with the capacitance C1 is computed. Incidentally, "$\omega$" as used in the present application represents the angular frequency in radians per second, for which $\omega = 2\pi f$ holds.

An admittance Y is given by:

$$Y = \frac{1}{R_2 + j\omega L_1} + j\omega C_1 = \frac{R_2}{R_2^2 + \omega^2 L_1^2} + j\omega\left(C_1 - \frac{L_1}{R_2^2 + \omega^2 L_1^2}\right) \quad (9)$$

Since resonance is produced when an imaginary part is zero, the resonant frequency $\omega 0$ becomes as follows:

$$\omega_0 = \sqrt{\frac{1}{L_1 C_1} - \frac{R_2^2}{L_1^2}} \quad (10)$$

In view of this relationship, a condition that makes the resonant frequency $\omega 0$ constant is expressed by:

$$C_1 = \frac{L_1}{R_2^2 + \omega_0^2 L_1^2} \quad (11)$$

By substituting this equation (11) into the expression of |Z|, the computation is performed.

When f0=10 GHz (=$\omega 0/2\pi$), L1=1 nH, R2=0Ω, L3=0.03 nH, and C3=0.2 pF, it can be seen that impedance Z falls to approximately 0 ohms at 8.4 GHz, as shown in FIG. 15.

Inventors of the present invention have first found that though the LPF side in FIG. 12 should originally have a high impedance, the short circuit as described above is caused, so that a pass characteristic of the filter side which is turned on or the HPF side deteriorates and a phase shift amount also has a minute rise and fall (such as an irregularity or a bump) caused by resonance. This fact is not described in any document known to the inventors. Then, this causes deterioration of an RMS phase shift error.

In the layout where a capacitor is connected in series with an inductor so as to allow measurement of a DC characteristic of an FET, a capacitor 2 is laid out outside a non-close-packed inductor 1, as shown in FIG. 16.

In this layout configuration, a Q factor is high, as shown in a comparative example in FIG. 8 as a "related art". Thus, an unwanted rise and fall caused by resonance is produced in a frequency characteristic of a phase shift amount.

SUMMARY OF THE INVENTION

In order to solve the problem described above, the invention disclosed in this application is generally configured as follows.

According to a first aspect (aspect) of the present invention, there is provided a microwave phase shifter including switches each of which utilizes resonance between an off-capacitance of an FET and an inductor connected in parallel with the off-capacitance of the FET, a low-pass filter, and a high-pass filter. In each portion of the resonance, a series circuit of the inductor and an MIM capacitor is arranged in parallel with the FET. In a layout of the LC series-connected circuit, though the inductor is of a non-close-packed structure, a metal or a dielectric material with a relative dielectric constant higher than a relative dielectric constant of a dielectric substrate is arranged in a free region in a central portion of the inductor.

According to another aspect of the present invention, there is provided a microwave phase shifter including switches each of which utilizes resonance between an off-capacitance of an FET and an inductor connected in parallel with the off-capacitance of the FET, a low-pass filter, and a high-pass filter. In each portion of the resonance, a series circuit of the inductor and an MIM capacitor is arranged in parallel with the FET. Then, in a layout of the LC series-connected circuit, the inductor is of a non-close-packed structure, and the MIM capacitor is arranged in a free region in a central portion of the inductor.

According to the present invention, there is provided a semiconductor device in which in a layout where an inductor is connected to a capacitor in series, the capacitor is arranged in a region inside the inductor even if the inductor is of a non-close-packed structure. Alternatively, there may be provided a semiconductor device in which in a layout where an inductor is connected to a capacitor in series, the inductor is made to be of a close-packed structure and the capacitor is arranged outside the inductor.

The meritorious effects of the present invention are summarized as follows.

According to the present invention, a Q factor of LC series resonance is reduced, so that a short circuit of an LPF side (an off side) can be prevented. Thus, a pass characteristic magnitude (S21) at an on side does not deteriorate. A minute rise and fall (such as an irregularity or a bump) in a phase (S21), caused by resonance is also reduced. An RMS phase shift error is thereby improved. Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

Figure 10:
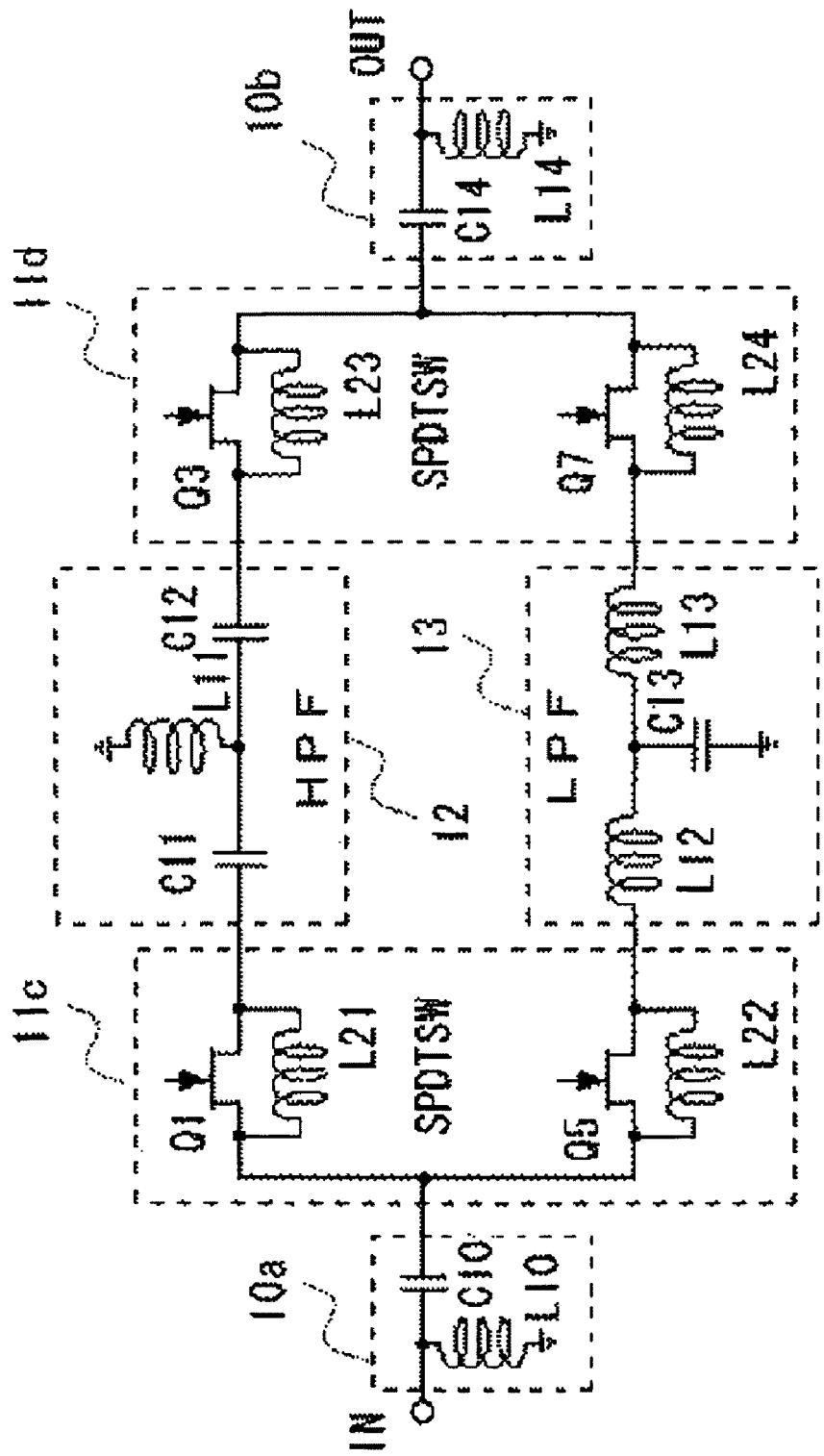
FIG. 10 is a diagram showing an example of a phase shifter of a related art.
Figure 11:
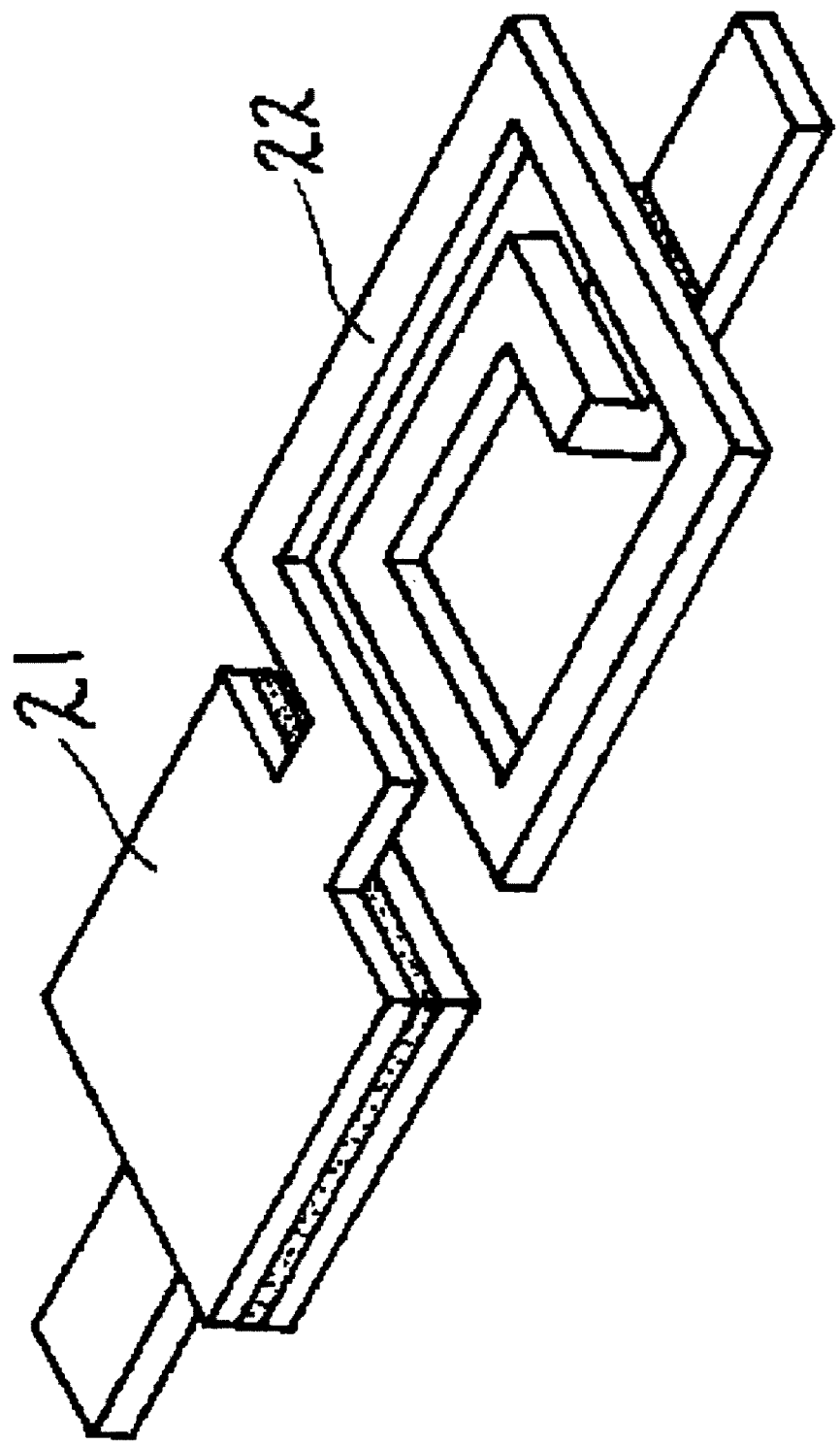
FIG. 11 is a diagram showing a layout of a phase shifter of a related art.

In order to describe the above-mentioned present invention in further detail, a description will be given below with reference to appended drawings. In a microwave phase shifter (refer to FIG. 10, for example) of the present invention, which includes switches each of which utilizes resonance between an off-capacitance of an FET and an inductor connected in parallel with the off-capacitance of the FET, an LPF, and an HPF, a series circuit of the inductor and a capacitor is arranged in parallel with the FET in each portion of the resonance. Then, in a layout of the LC series connection circuit, a metal or a dielectric material having a relative dielectric constant higher than that of a dielectric substrate is arranged in a free space in a central portion of the inductor which is made to have a non-close-packed structure.

Figure 12:
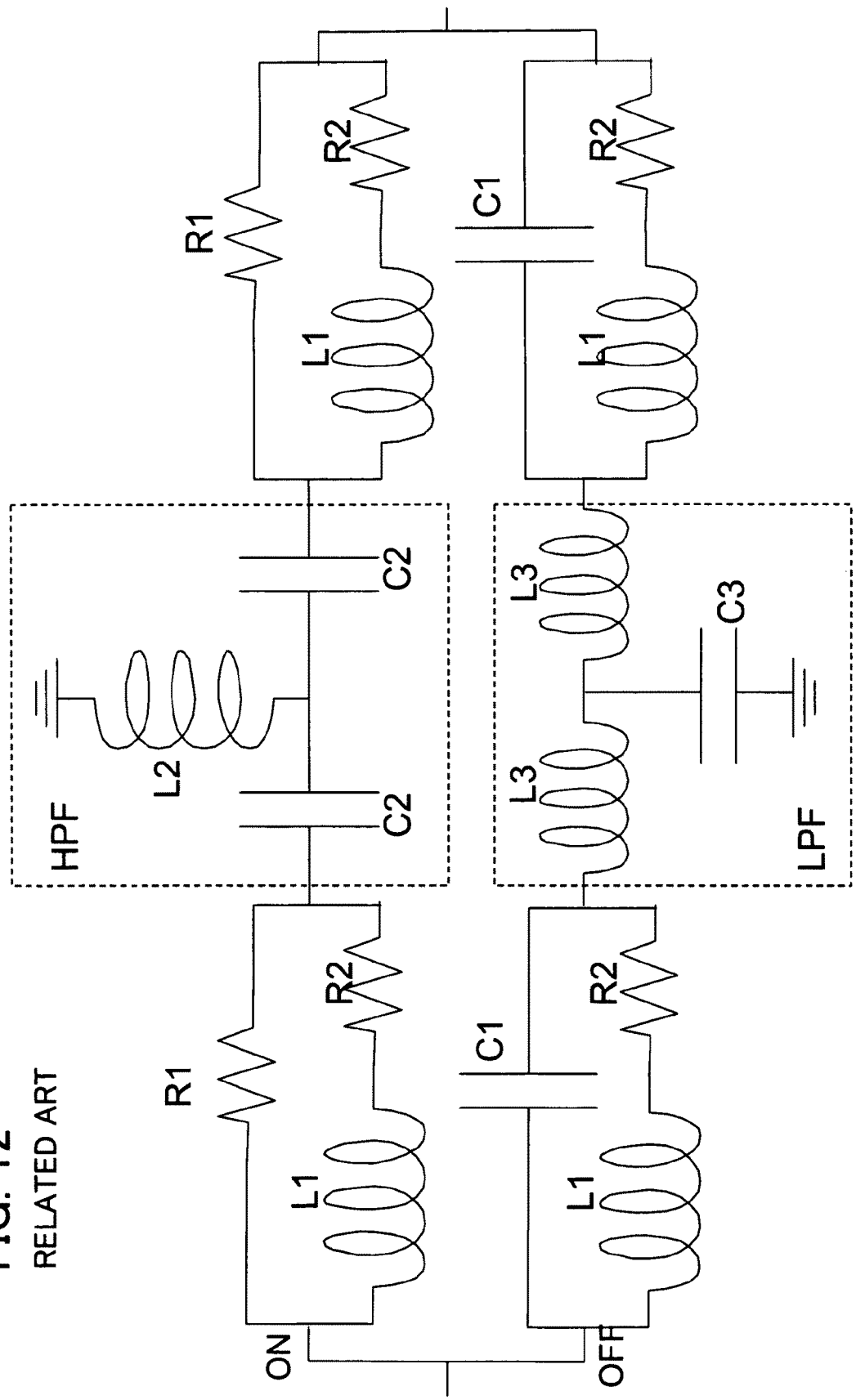
FIG. 12 is a diagram showing an equivalent circuit of a phase shifter of a related art.
Figure 13:
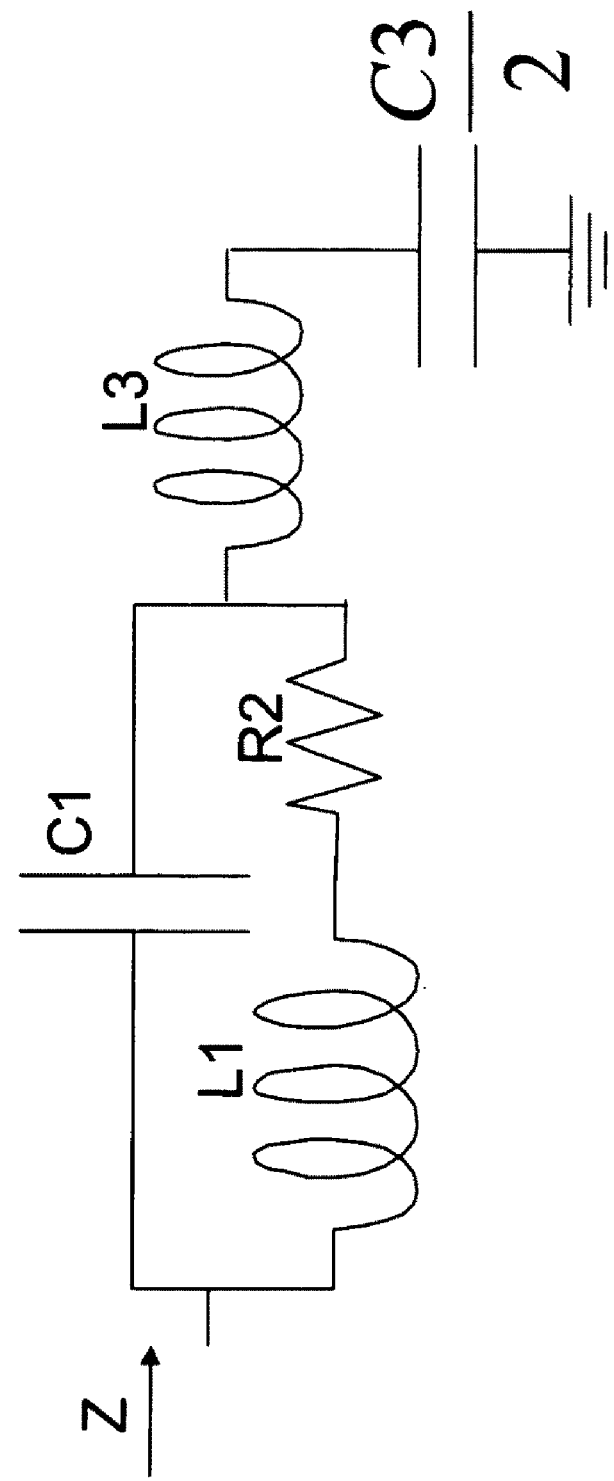
FIG. 13 is a diagram showing an equivalent circuit for the phase shifter of a related art.
Figure 14:
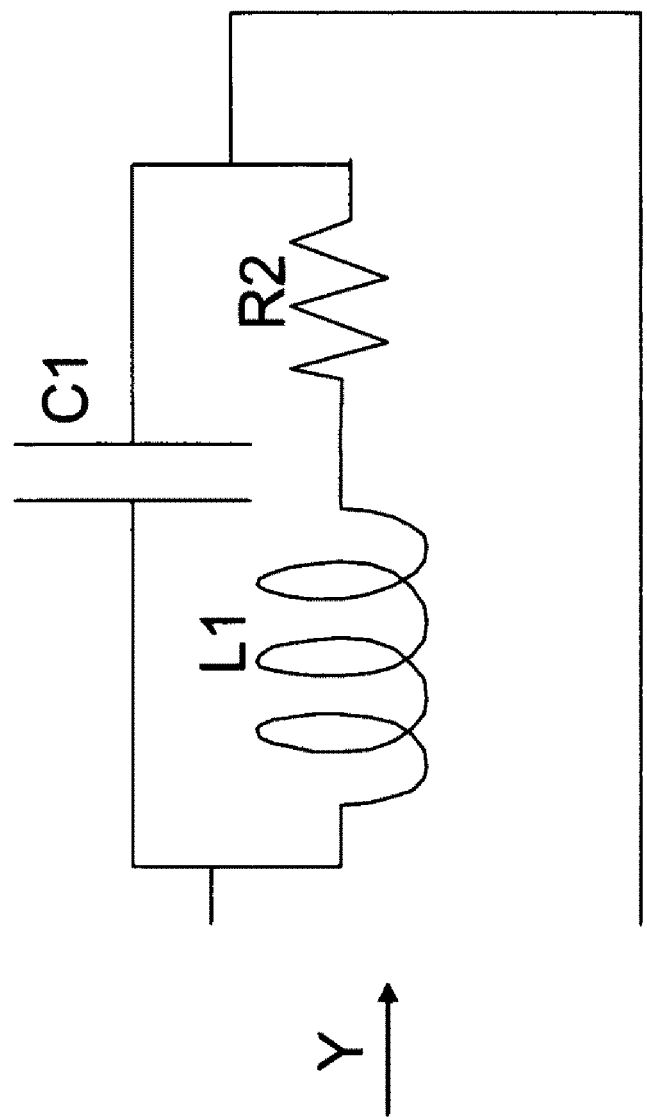
FIG. 14 is a diagram showing a circuit of a related art in which a series connection of an inductor L and a resistance R is connected to a capacitance C in parallel.

A discontinuity of a phase frequency characteristic of a phase shifter occurs due to a low impedance circuit of an LPF side caused by a resonant circuit when an HPF side is turned on and the LPF side is turned off. The resonant circuit is formed of an off-capacitance (indicated by reference numeral C1 in FIG. 12) of an FET on the LPF side, an inductance of an inductor (L1) in a switch unit, an MIM (Metal Insulator Metal) shunt capacitor (indicated by reference numeral C3 in FIG. 12) of an LPF, and series inductors (each indicated by reference numeral L3) of the LPF. In order to increase resistances of inductors in switch units and allow measurement of an FET DC characteristic in a phase shifter of the present invention, an MIM capacitor for DC blocking is connected to each inductor connected in parallel with an FET (such as an inductor L21 connected in parallel with an FET Q1, an inductor L22 connected in parallel with an FET Q5, an inductor L23 connected in parallel with an FET Q3, and an inductor L24 connected in parallel with an FET Q7), as means for solving this phenomenon. Then, in a layout of the inductor, an inside free space is eliminated in order to reduce a Q factor. A description will be given below in connection with some examples.

FIRST EXAMPLE

Figure 1:
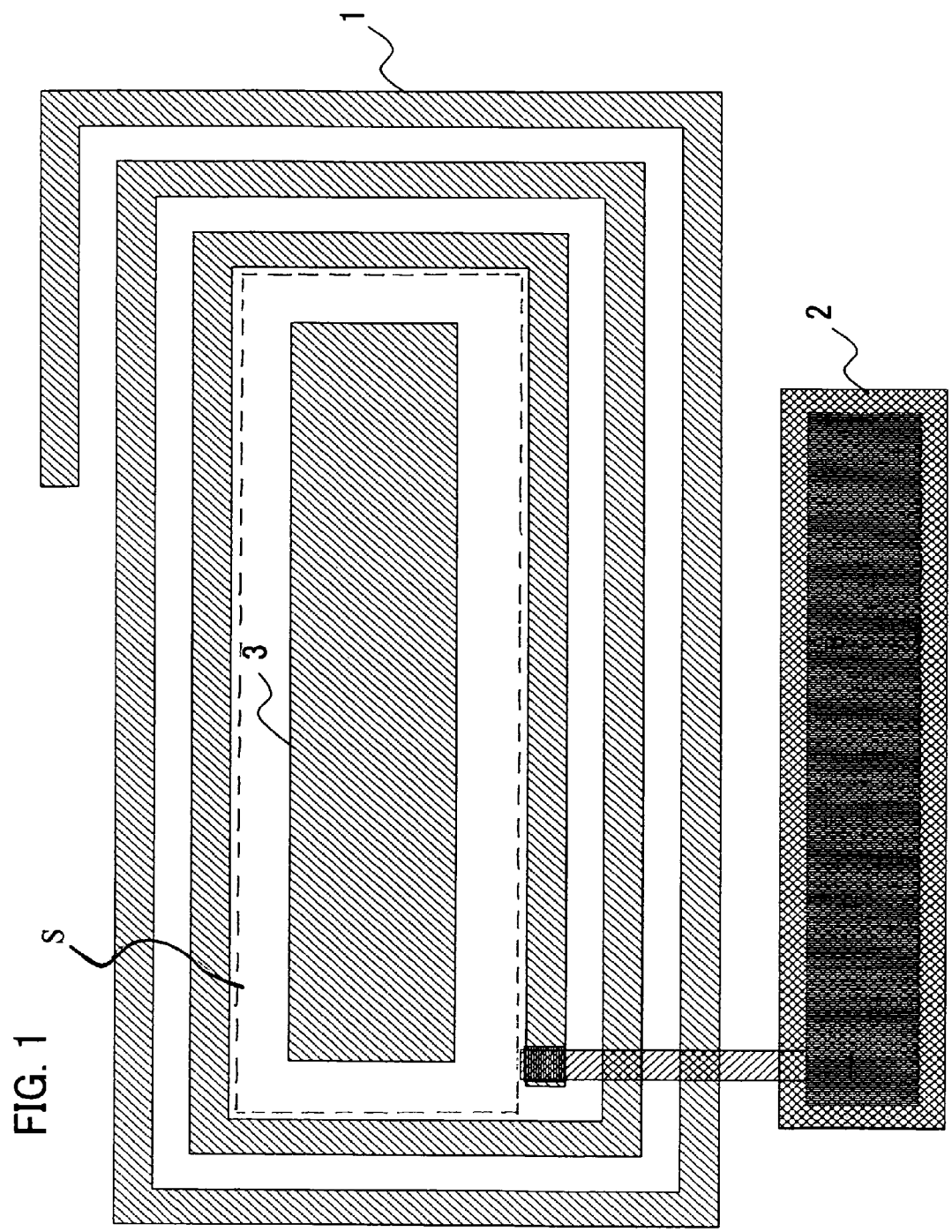
FIG. 1 is a diagram showing a layout of a first example of the present invention.

As shown in FIG. 1, in a layout configuration where a capacitor 2 is arranged outside a non-close-packed inductor 1, an electrically isolated metal member 3 (or a dielectric material having a high relative dielectric constant) is arranged in a free space in a central portion of the inductor 1 in this example.

"Non-close-packed" refers to a layout where an innermost segment of the inductor 1 is shorter than a maximum length which can be wired and both sides of the segment have a same spacing to an interconnect, or a layout where a spacing between one side of the innermost segment of the inductor and the interconnect where an electric current flows in an opposite direction to the electric current of the innermost segment of the inductor is increased and a spacing between the other side of the inner most segment of the inductor and the interconnect where the electric current flows in a same direction as the electric current of the innermost segment of the inductor is reduced.

Referring to FIG. 1, the metal member 3 arranged in the free space in the central portion of the inductor 1 is made of a thin-film metal, corresponding to the planar type thin-film inductor. A plane shape of the metal member 3 is set to be rectangular, corresponding to an inside shape of the free space in the central portion of the inductor 1. The present invention is not of course limited to such a shape or the like.

The inductor 1 of the non-close-packed structure has a free region in the center thereof, and the area of the free region is indicated by S.

A case where electric power is supplied from one side of the inductor 1 is regarded as a case where a current I is fed with a voltage thereof being constant. When a magnetic flux is indicated by Φ, the following electromotive force V is induced in the free region S inside the inductor, based on Faraday's law of electromagnetic induction:

$$V = -\frac{d\Phi}{dt} \quad (12)$$

When a magnetic flux density is indicated by B (=μH, in which H indicates a magnetic field, and μ indicates a magnetic permeability), the magnetic flux Φ is equal to BS. Thus, the following expression holds:

$$V = -\frac{d(BS)}{dt} \quad (13)$$

When a change in resistance of the inductor caused by this electromotive force is indicated by ΔR, the change ΔR is given as follows:

$$\Delta R = \frac{V}{I} = -\frac{1}{I}\frac{d\Phi}{dt} \quad (14)$$

in which a minus sign indicates a fall from an original resistance value.

On the other hand, a Q factor is given as follows:

$$Q = \frac{\omega L}{R + \Delta R} = \frac{\omega L}{R - \frac{1}{I}\frac{d\Phi}{dt}} \quad (15)$$

It can be seen that the Q factor becomes larger than an original value thereof.

Figure 8:
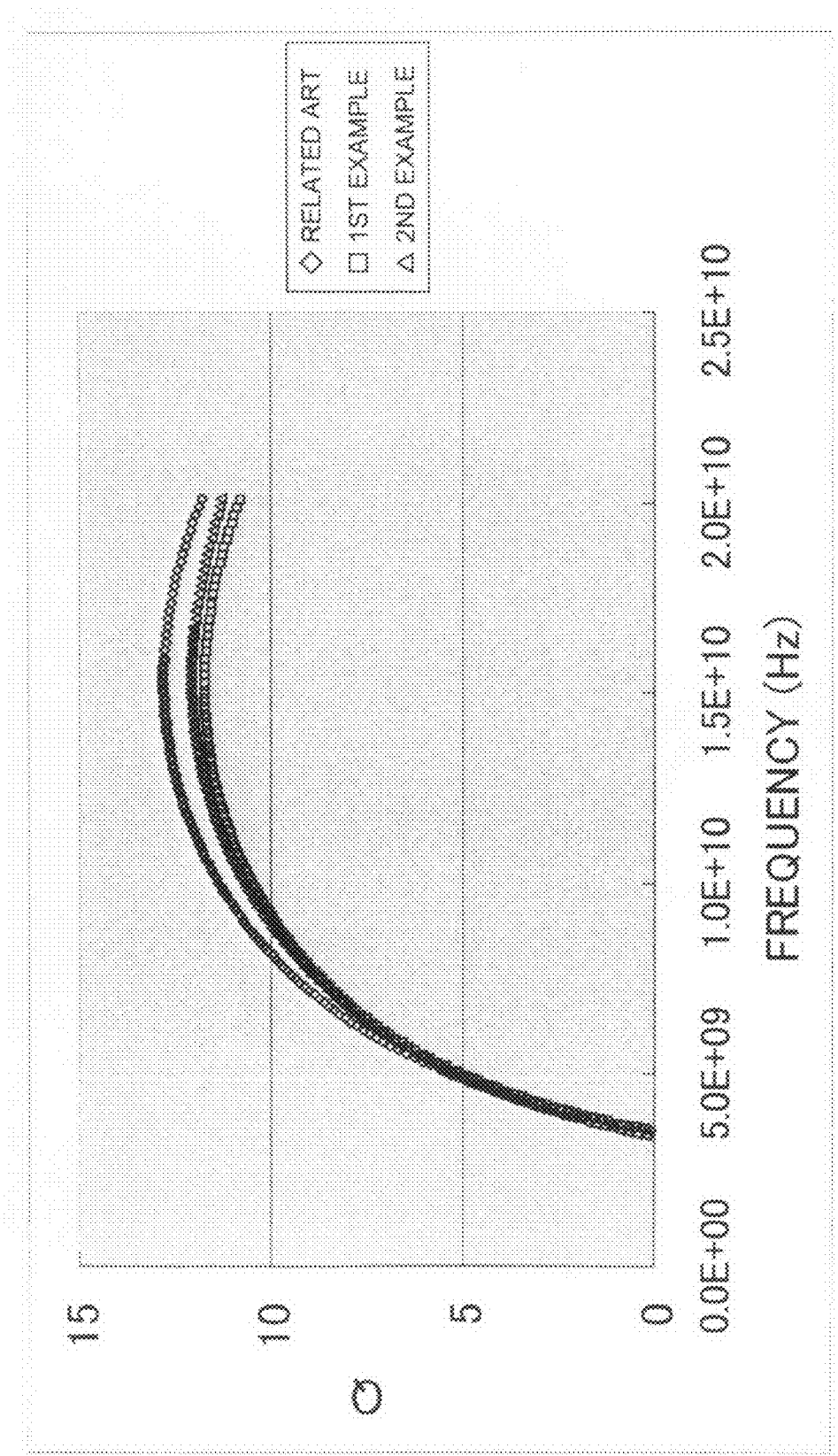
FIG. 8 is a graph showing Q factor computation results determined by differences among layouts of an inductor and a capacitor connected in series.

Accordingly, as shown in data for a "related art" example in FIG. 8, the Q factor increases.

In the present invention, as shown in FIG. 1, there is very little area S. Thus, the magnetic flux Φ=BS is reduced. The change ΔR thus becomes almost zero, according to Expression (14). Then, a denominator R+ΔR in Expression (15) is not reduced, and the Q factor remains low.

Figure 2:
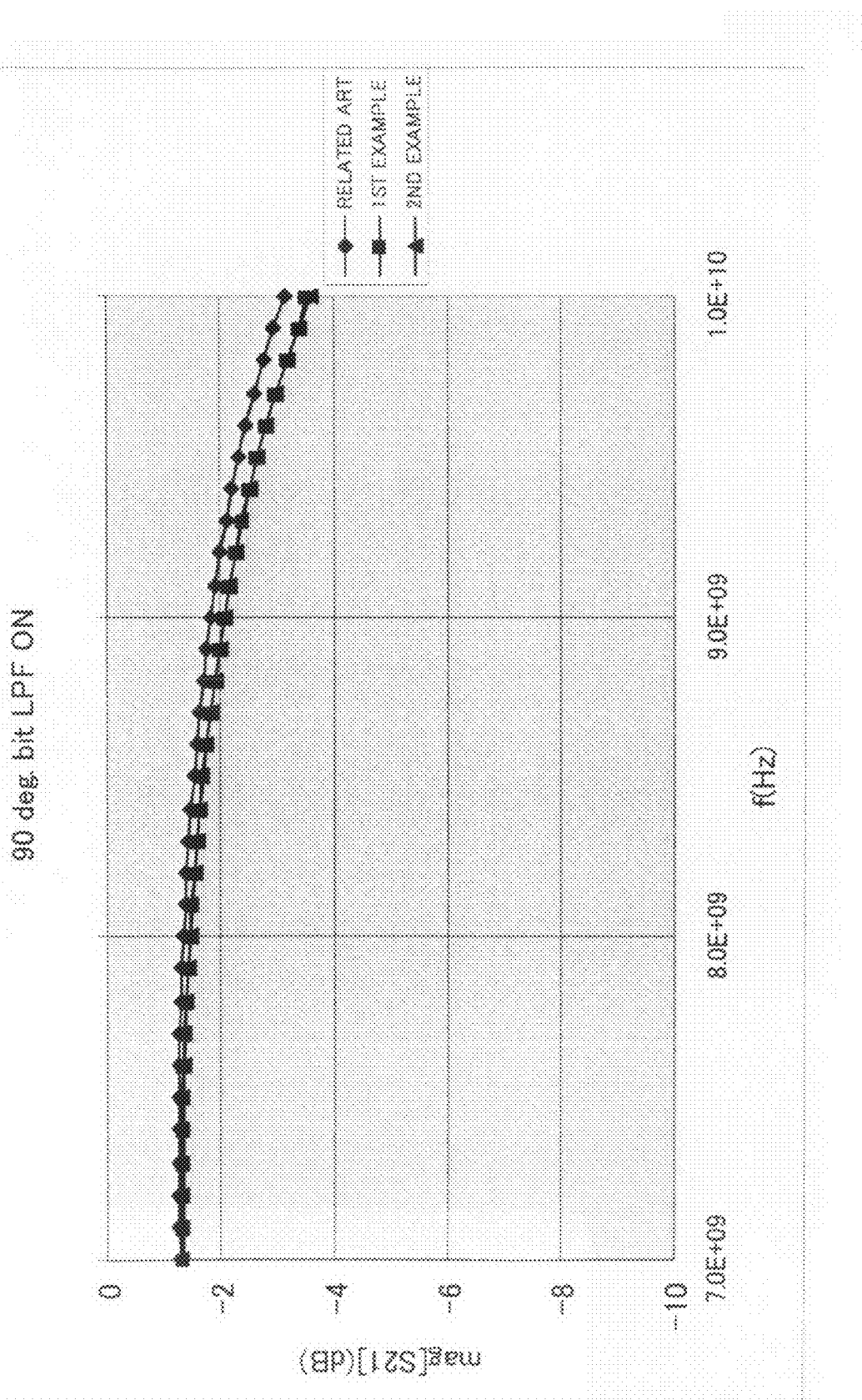
FIG. 2 is a graph showing a computation result of the first example (a magnitude [S21](a pass characteristic) when an LPF side is on)
Figure 3:
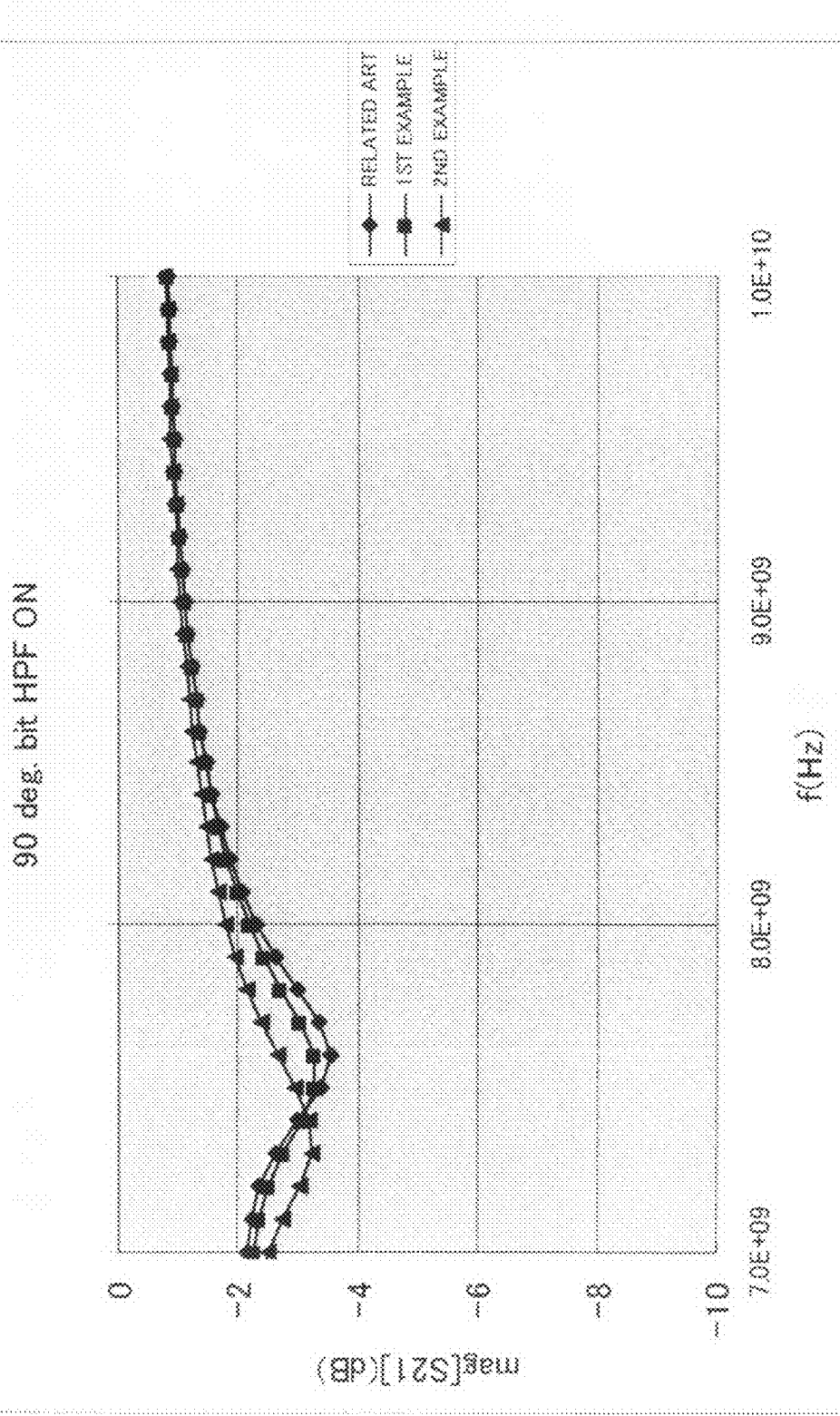
FIG. 3 is a graph showing a computation result of the first example (magnitude [S21](pass characteristic) when an HPF side is on)

As the first example, FIG. 2 shows a magnitude of a pass characteristic when the LPF side of the phase shifter is turned on. FIG. 3 shows a magnitude of the pass characteristic when the HPF side of the phase shifter is turned on, FIG. 4 shows a phase of the pass characteristic when the LPF side of the phase shifter is turned on, FIG. 5 shows a phase of the pass characteristic when the HPF side of the phase shifter is turned on, and FIG. 6 shows a difference between FIGS. 4 and 5, or a phase shift amount.

Figure 4:
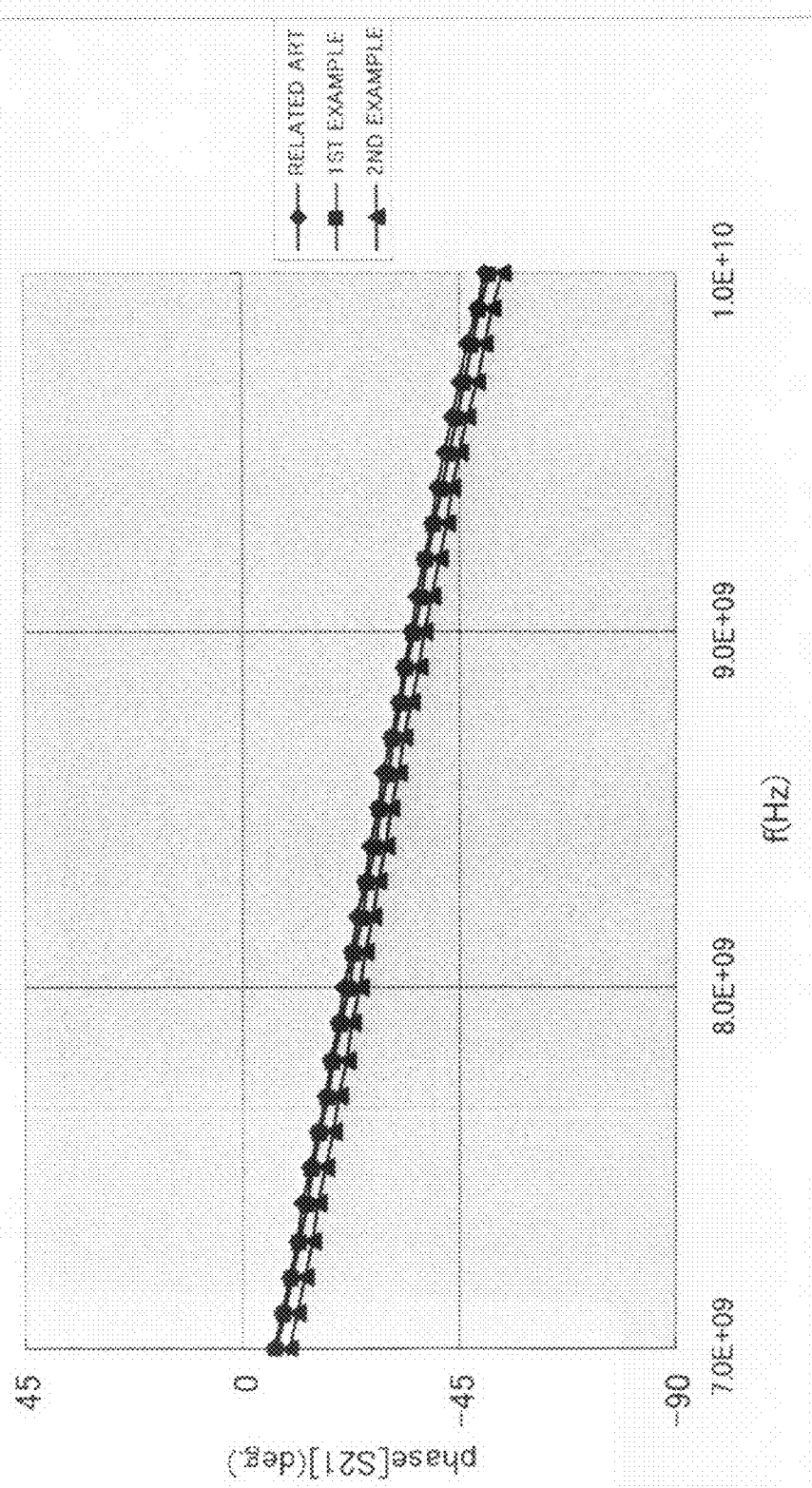
FIG. 4 is a graph showing a computation result of the first example (a phase [S21](pass characteristic) when the LPF side is on)
Figure 5:
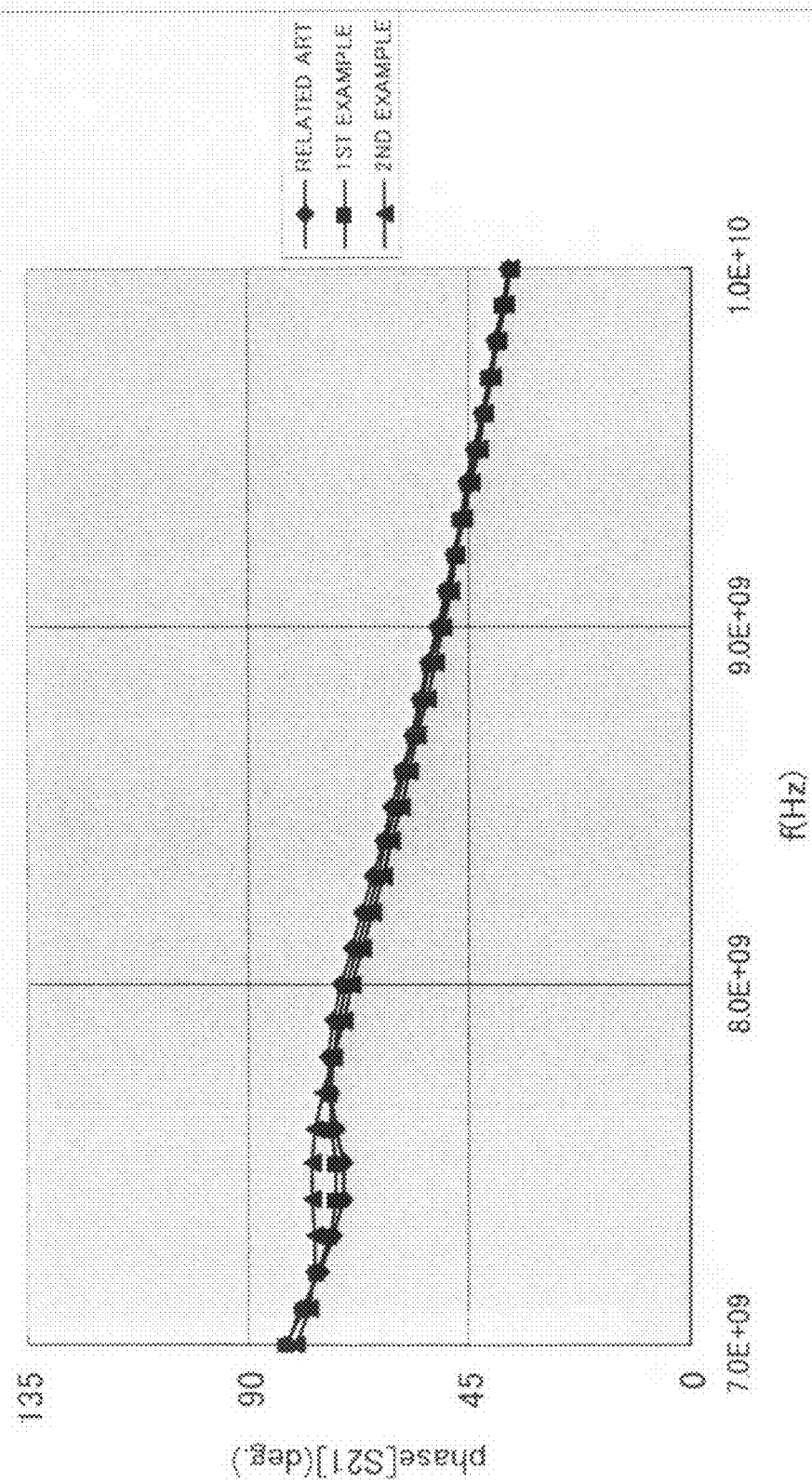
FIG. 5 is a graph showing a computation result of the first example (phase [S21](pass characteristic) when the HPF side is on)
Figure 6:
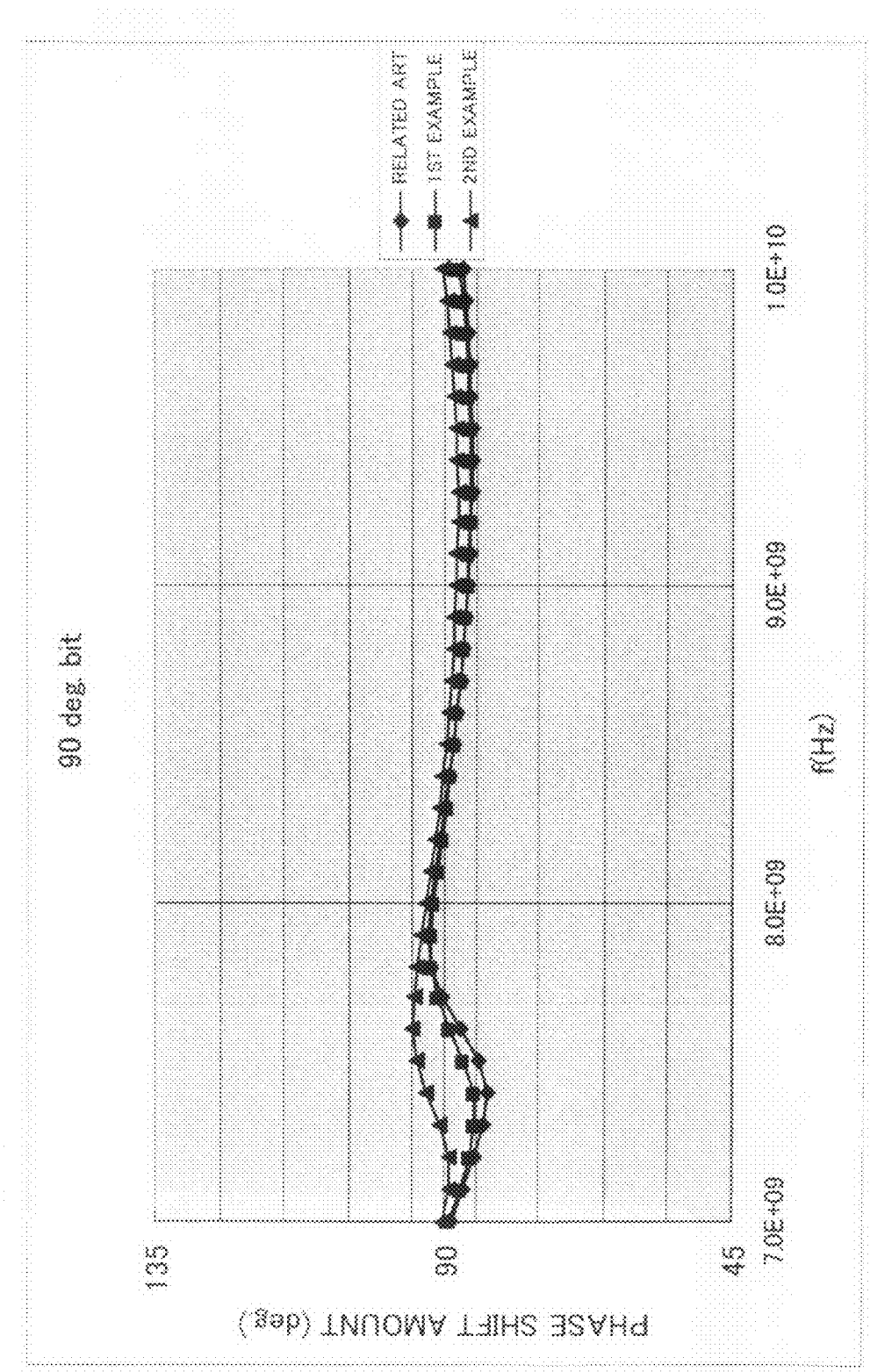
FIG. 6 is a graph showing a computation result (which is a difference between FIGS. 12 and 13 and a phase shift amount) of the first example.
Figure 7:
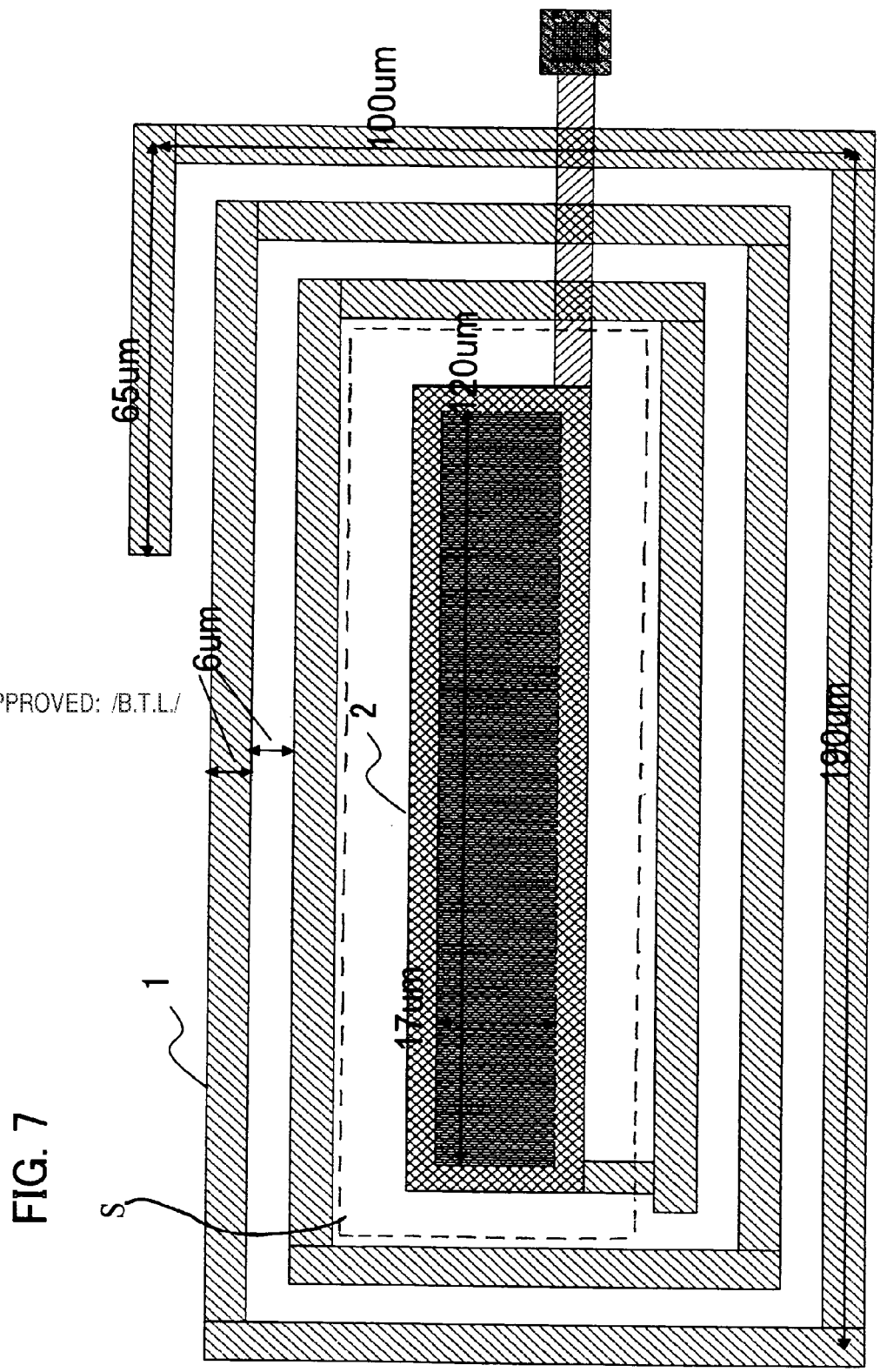
FIG. 7 is a diagram showing a layout of a second example of the present invention.
Figure 9:
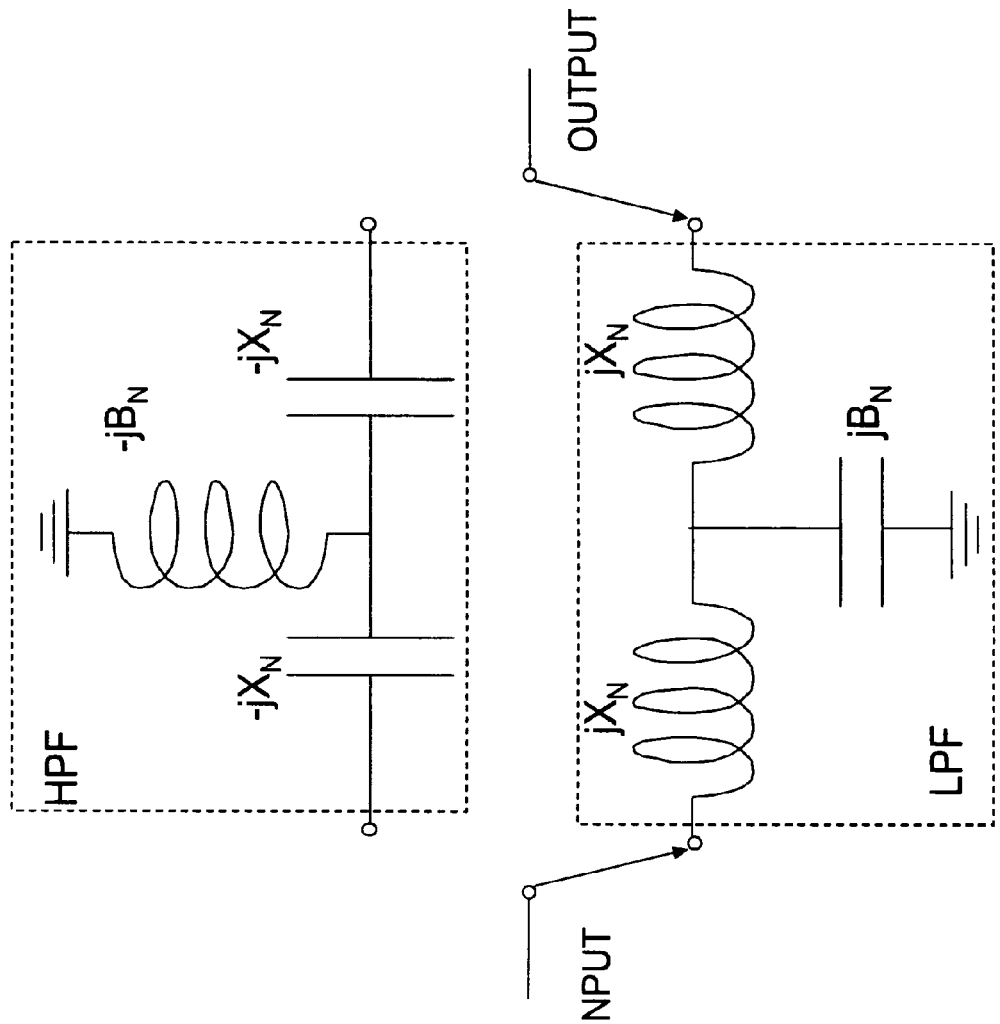
FIG. 9 is a diagram showing filter unit circuits of a related art HPF/LPF switching type phase shifter.
Figure 15:
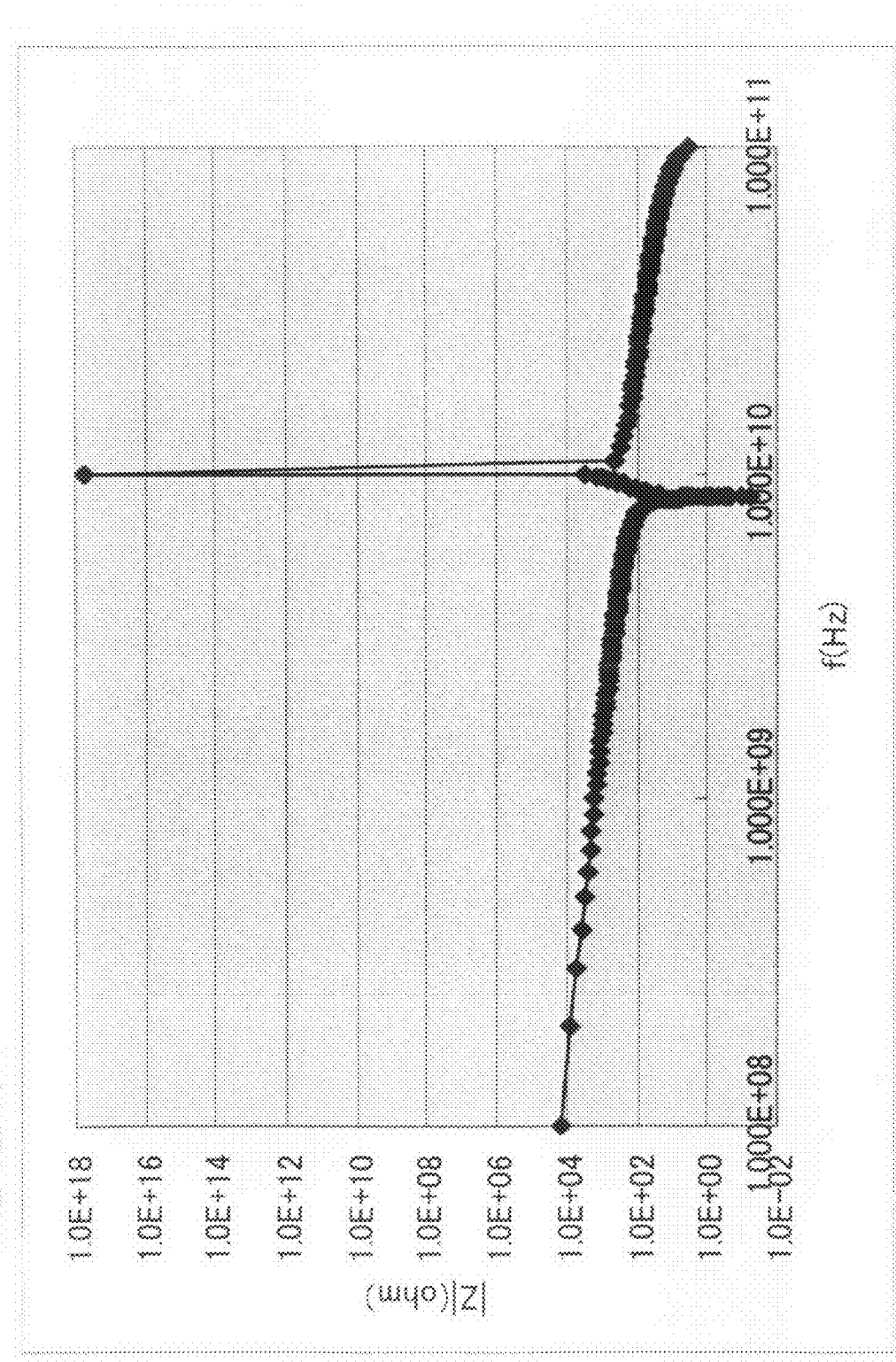
FIG. 15 is a graph showing a result of computation of a frequency characteristic of an impedance in the related art circuit in FIG. 13.
Figure 16:
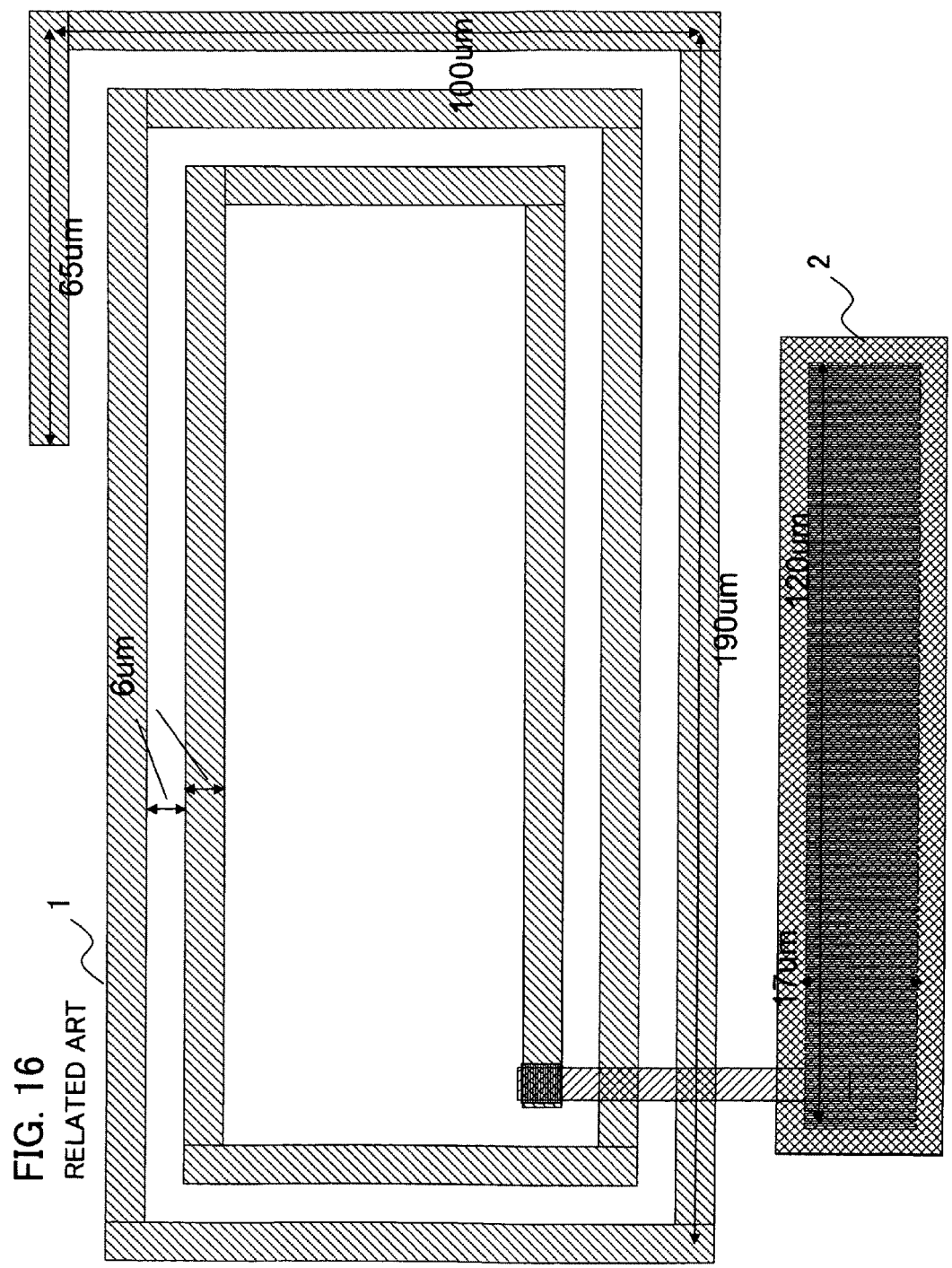
FIG. 16 is a diagram showing a layout of a related art.

Incidentally, in FIG. 2-5, "90 deg. bit LPF" and "90 deg. Bit HPF" indicate filters designed so as to provide angular phase difference of a signal at 90 degrees, when the signal passed these two filters, and "f(Hz)" indicates the frequency in Hertz. In FIGS. 2-3, "mag[S21](dB)" indicates the magnitude of insertion loss, in units of decibels. In FIG. 4-5, "phase[S21] (deg)" indicates the phase of insertion loss, in units of degrees. In FIG. 6, "phase shift amount (deg)" indicates the phase shift, in units of degrees. "Relative phase" and "phase difference" have the same meaning as "phase shift." In FIGS. 7 and 16. "um" indicates unit of micrometers. In FIG. 7, "1" indicates "inductor 1." In FIG. 8, "FREQUENCY(Hz)" indicates frequency in Hertz: "1ST EXAMPLE" indicates first example, and "2ND EXAMPLE" indicates second example. In FIG. 9, "INPUT" denotes input, and "OUTPUT" denotes output. In FIG. 15. "|Z|(ohm)" indicates impedance measured in ohms, "||" (absolute value symbol) indicates the vector value, as commonly understood by those skilled in the art, and "f(Hz)" indicates the frequency in Hertz.

FIGS. 2 to 6 show characteristics of a related art (indicated by a rhombus), the first example (indicated by ■), and a second example (indicated by ▲), respectively.

It can be seen from FIG. 3 that a loss close to 7.5 GHz decreases more in the first example than the related art. As a result, the phase in FIG. 5 in the first example is also improved.

For this reason, the phase shift amount in FIG. 6 is also improved. In a band from 7 GHz to 10 GHz, an RMS phase shift error is also improved to be 2.9 degrees, compared with 3.4 degrees in the related art.

By decreasing the area S of the free space inside the inductor, and increasing a length L of the inductor or using a material with a large resistivity ρ to increase the resistance R, reduction of the Q factor becomes more effective.

SECOND EXAMPLE

Next, a second example of the present invention will be described. FIG. 7 is a diagram showing a layout of the second example. In the first example in FIG. 1, the metal member 3 is laid out in the free space in the central portion of the non-close-packed inductor 1, and the capacitor 2 is laid out outside, for series connection. In the second example, the MIM capacitor 2 is laid out in the free space in the central portion in place of the metal member 3 shown in FIG. 1. Dimensions (numerical values) of a layout pattern in FIG. 7 are illustrated, being associated with FIG. 16. The present invention is not of course limited to such dimensions.

As in the first example, there is a free space inside the inductor 1. Since the MIM capacitor 2 is arranged in the free space, a magnetic field is generated. However, an area S of the free space is almost zero.

Accordingly, as shown in data on the second example in FIGS. 2 to 5, it can be seen that improvements from the related art have been made. In the band from 7 GHz to 10 GHz, an RMS phase shift error is improved to be 2.3 degrees from 3.4 degrees of the RMS phase shift error of the related art.

Since the area S where the magnetic field penetrates is almost zero as in the first example, an induced electromotive force becomes almost zero. Since a resistance change ΔR is almost zero, a Q factor will not increase.

A circuit of the second example is the same as that of the first example. There is, however, a layout difference between placing the electrically isolated metal member in the free space in the central portion inside the inductor 1 and placing the MIM capacitor in the free space in the central portion inside the inductor 1.

The above description was given in connection with the examples described above. The present invention is not, however, limited to configurations of the examples described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A phase shifter including:
a dielectric substrate;
first and second pairs of switches;
a low-pass filter connected between said first pair of switches; and
a high-pass filter connected between said second pair of switches,
each said switch utilizing a resonance between an off-capacitance of an FET (field effect transistor) and an inductor connected in parallel with the off-capacitance of the FET, wherein
each switch has an LC series circuit comprising the inductor and an MIM (Metal Insulator Metal) capacitor arranged two-dimensionally in parallel with the FET on a surface of said dielectric substrate, and
in the LC series circuit, a metal or a dielectric material with a relative dielectric constant higher than a relative dielectric constant of said dielectric substrate is arranged in a free region in a central portion of the inductor laid out to have a non-close-packed structure.

2. The phase shifter according to claim 1, wherein for each said switch, said metal or dielectric material with a relative dielectric constant higher than a relative dielectric constant of said dielectric substrate comprises a shape corresponding to an inside shape of said free region in said central portion of said inductor.

3. The phase shifter according to claim 1, wherein for each said switch an open area of said free region, in said central portion of the inductor but outside of said metal or dielectric material with a relative dielectric constant higher than the relative dielectric constant of said dielectric substrate, is approximately zero.

4. The phase shifter according to claim 1, wherein an RMS (root mean square) phase shift error is less than 3.4 degrees in a band from 7.0 GHz to 10.0 GHz.

5. The phase shifter according to claim 4, wherein said RMS phase shift error comprises at most 2.9 degrees.

6. A semiconductor device comprising the phase shifter as set forth in claim 1.

7. The phase shifter according to claim 1, wherein for each said switch said inductor comprises a rectangular spiral microcircuit approximately 100 μm×190 μm.

8. The phase shifter according to claim 1, wherein said non-close-packed structure comprises a layout wherein:
for each said switch, an innermost segment of said inductor is shorter than a maximum length which can be wired, and
both sides of a segment of said inductor have a same spacing to an interconnect.

9. The phase shifter according to claim 1, wherein said non-close-packed structure comprises a layout wherein:
for each said switch, a spacing between one side of an innermost segment of said inductor and an interconnect where an electric current flows in an opposite direction to an electric current of said innermost segment of said inductor is increased, and
a spacing between an other side of said innermost segment of said inductor and said interconnect where an electric current flows in a same direction as said electric current of said innermost segment of said inductor is reduced.

10. A phase shifter of a low-pass/high-pass filter switching type comprising a plurality of resonant-type switches each including a series circuit of an inductor and a capacitor in parallel with an FET on a dielectric substrate,
wherein a metal member or a dielectric member comprising a relative dielectric constant higher than a relative dielectric constant of said dielectric substrate is arranged in a free region of the inductor of a planar type having the free region in a central portion thereof.

11. A phase shifter including:
first and second pairs of switches;
a low-pass filter connected between said first pair of switches; and
a high-pass filter connected between said second pair of switches,
each said switch utilizing a resonance between an off-capacitance of an FET (field effect transistor) and an inductor connected in parallel with the off-capacitance of the FET, wherein
an LC series circuit comprising the inductor and an MIM (Metal Insulator Metal) capacitor is arranged in parallel with each FET,
in the LC series circuit, the MIM capacitor is arranged in a free region in a central portion of the inductor laid out to have a non-close-packed structure, and
said non-close-packed structure comprises a layout wherein:
for each said switch, an innermost segment of said inductor is shorter than a maximum length which can be wired, and
both sides of a segment of said inductor have a same spacing to an interconnect.

12. The phase shifter according to claim 11, wherein for each said switch an open area of said free region, in said central portion of the inductor but outside of said MIM capacitor, is approximately zero.

13. The phase shifter according to claim 11, wherein for each said switch, said MIM capacitor comprises a shape corresponding to an inside shape of said free region in said central portion of said inductor.

14. A semiconductor device comprising the phase shifter as set forth in claim 11.

15. The phase shifter according to claim 11, wherein said non-close-packed structure comprises a layout wherein:

for each said switch, a spacing between one side of an innermost segment of said inductor and an interconnect where an electric current flows in an opposite direction to an electric current of said innermost segment of said inductor is increased, and a spacing between an other side of said innermost segment of said inductor and said interconnect where an electric current flows in a same direction as said electric current of said innermost segment of said inductor is reduced.

16. The phase shifter according to claim 11, wherein an RMS (root mean square) phase shift error is less than 3.4 degrees in a band from 7.0 GHz to 10.0 GHz.

17. The phase shifter according to claim 16, wherein said RMS phase shift error comprises at most 2.3 degrees.

18. A phase shifter comprising:

an LC resonant circuit including an inductor of a planar type comprising a free region in a central portion thereof and a capacitor, said LC resonant circuit composing a resonant-type switch; and an electrically isolated metal member arranged in said free region of said inductor.

* * * * *